United States Patent
GopalaKrishnaSetty et al.

(10) Patent No.: US 9,934,348 B2
(45) Date of Patent: Apr. 3, 2018

(54) ADJUSTING SCAN CONNECTIONS BASED ON SCAN CONTROL LOCATIONS

(71) Applicant: International Business Machines Corporation, Armonk, NY (US)

(72) Inventors: Raghu G. GopalaKrishnaSetty, Bangalore (IN); Ankit N. Kagliwal, Nagpur (IN); Sridhar H. Rangarajan, Bangalore (IN); James D. Warnock, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/973,764

(22) Filed: Dec. 18, 2015

(65) Prior Publication Data

US 2017/0177777 A1 Jun. 22, 2017

(51) Int. Cl.
*G06F 17/50* (2006.01)
*G01R 31/317* (2006.01)
(52) U.S. Cl.
CPC ... *G06F 17/5072* (2013.01); *G01R 31/31704* (2013.01); *G01R 31/31723* (2013.01)
(58) Field of Classification Search
USPC .......................................................... 716/119
See application file for complete search history.

(56) References Cited

U.S. PATENT DOCUMENTS

| 6,405,355 | B1 | 6/2002 | Duggirala et al. |
| 6,675,364 | B1 | 1/2004 | Basto et al. |
| 7,301,836 | B1 | 11/2007 | Raghavan et al. |
| 7,721,171 | B2 | 5/2010 | Erle et al. |
| 7,987,400 | B2 | 7/2011 | Berry et al. |
| 7,996,805 | B2 | 8/2011 | Pasqualini |
| 8,332,699 | B2 | 12/2012 | Chandra et al. |
| 8,954,912 | B2 | 2/2015 | Alpert et al. |
| 9,400,291 | B2 | 7/2016 | Johnson et al. |
| 2007/0168797 | A1* | 7/2007 | Fredrickson ... G01R 31/318583 714/726 |
| 2013/0117618 | A1 | 5/2013 | Kukreja et al. |

OTHER PUBLICATIONS

Parimi, "Leveraging Physically Aware Design-for-Test to Improve Area, Power and Timing", Cadence Design Systems, cadence®, printed on Aug. 20, 2015, pp. 1-4.

* cited by examiner

*Primary Examiner* — Eric Lee
(74) *Attorney, Agent, or Firm* — Gilbert Harmon, Jr.

(57) ABSTRACT

A method includes receiving a circuit design comprising an input scan chain comprising a plurality of latches connected by one or more scan connections, dividing the plurality of latches into one or more clusters, determining a number of scan controls for each cluster, placing the determined scan controls in selected locations; and adjusting the scan connections based on the scan control location. A corresponding computer system and computer program product are also disclosed.

20 Claims, 6 Drawing Sheets

ADJUSTING SCAN CONNECTIONS BASED ON SCAN CONTROL LOCATIONS

BACKGROUND OF THE INVENTION

The present invention relates generally to the field of integrated circuit layout, and more specifically to scan control testing of integrated circuits.

Scan chaining is a technique used in design for testing. The objective is to make testing easier by providing a simple way to set and observe every latch in an integrated circuit. The basic structure of scan includes an input signal and an output signal to define the input and output of the scan chain, a scan enable pin that, when asserted, prompts every latch in the design to be connected into a long shift register, and a clock signal used to control all of the latches in the chain. A scan chain requires a signal be passed through a scan control to enable all the latches to be monitored, which must be connected to the latches in the chain. These scan control elements are often added to a chip and incorporated into the existing connection structure.

SUMMARY

A method includes receiving a circuit design comprising an input scan chain comprising a plurality of latches connected by one or more scan connections, dividing the plurality of latches into one or more clusters, determining a number of scan controls for each cluster, placing the determined scan controls in selected locations; and adjusting the scan connections based on the scan control location. A corresponding computer program product and computer system are also disclosed herein.

DETAILED DESCRIPTION

The embodiments disclosed herein recognize that incorporating scan controls into an existing connection layout can result in more wiring than is necessary within the integrated circuit. Furthermore, a circuit layout that has been optimized without a scan connection in place is not necessarily an optimal layout when a scan connection has been introduced to the circuit. The embodiments disclosed herein enable circuit layout optimization with respect to an included scan connection.

Figure 1:
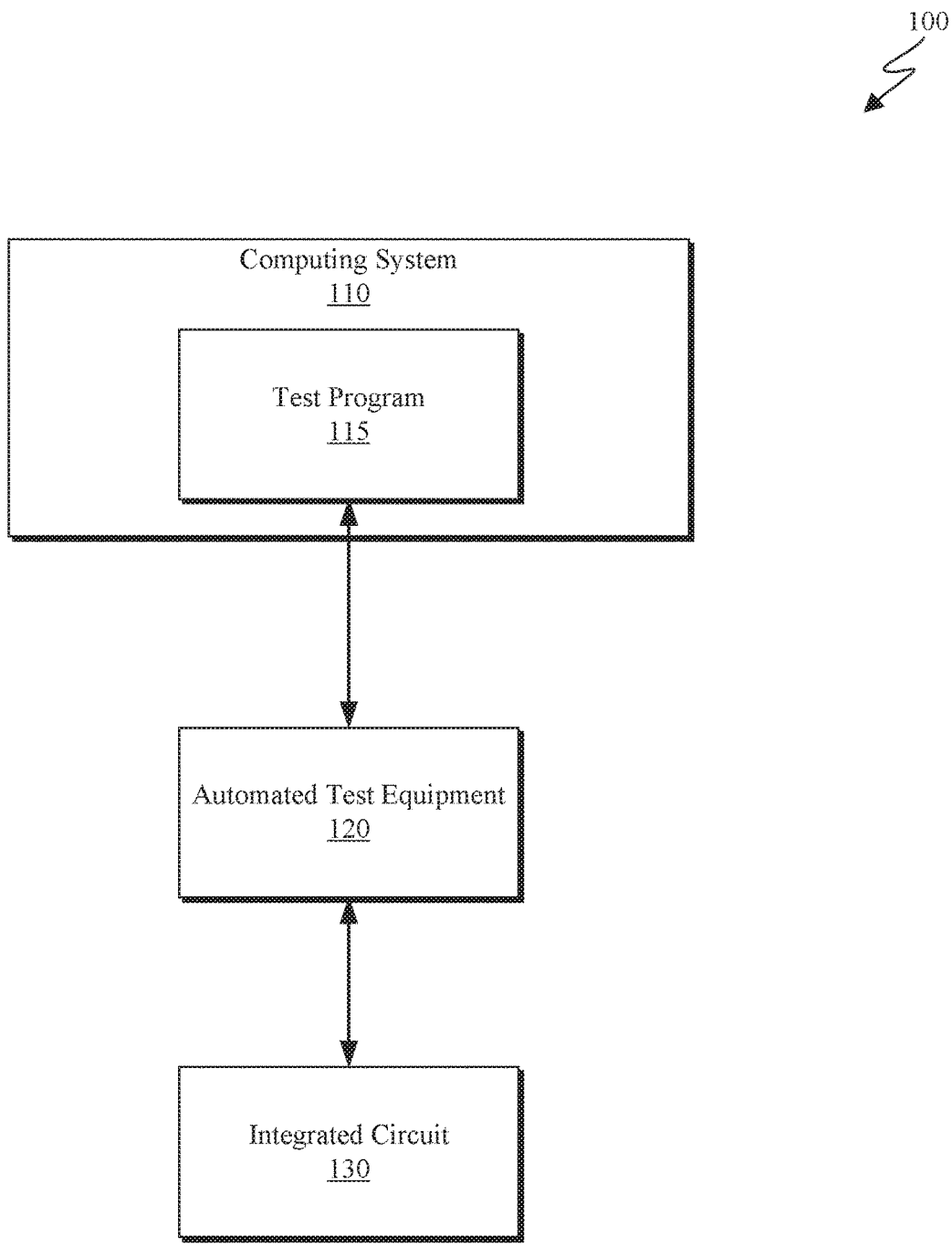
FIG. 1 is a block diagram depicting one example of a performance projection system in accordance with some embodiments of the present invention.

FIG. 1 is a block diagram depicting one example of a circuit testing environment 100 in accordance with some embodiments of the present invention. As depicted, testing environment 100 includes computer system 110, automated test equipment 120, and integrated circuit 130. Testing environment 100 is one example of a system in which a scan chain may be used to test an integrated circuit design.

Computer system 110 can be a desktop computer, a laptop computer, a specialized computer server, or any other computer system known in the art. In some embodiments, computer system 110 represents a computer system utilizing clustered computers and components to act as a single pool of seamless resources. In general, computer system 110 is representative of any electronic device, or combination of electronic devices, capable of executing machine-readable program instructions, as described in greater detail with regard to FIG. 4.

Automated test equipment (ATE) 120 may be any apparatus that performs tests on a device, known as the Device Under Test (DUT). In the depicted embodiment, the DUT is integrated circuit 130. Automated test equipment 120 may be a simple computer controlled digital multimeter or a system of multiple test instruments capable of automatically testing integrated circuit performance. ATE 120 may be configured to provide test results to test program 115 within computer system 110.

Integrated circuit 130 may be an integrated circuit to be tested by automated test equipment 120. In some embodiments, integrated circuit 130 comprises a plurality of latches connected by one or more scan connections. The scan connections may be used by ATE 120 to test a set of performance metrics for integrated circuit 130.

Figure 2:
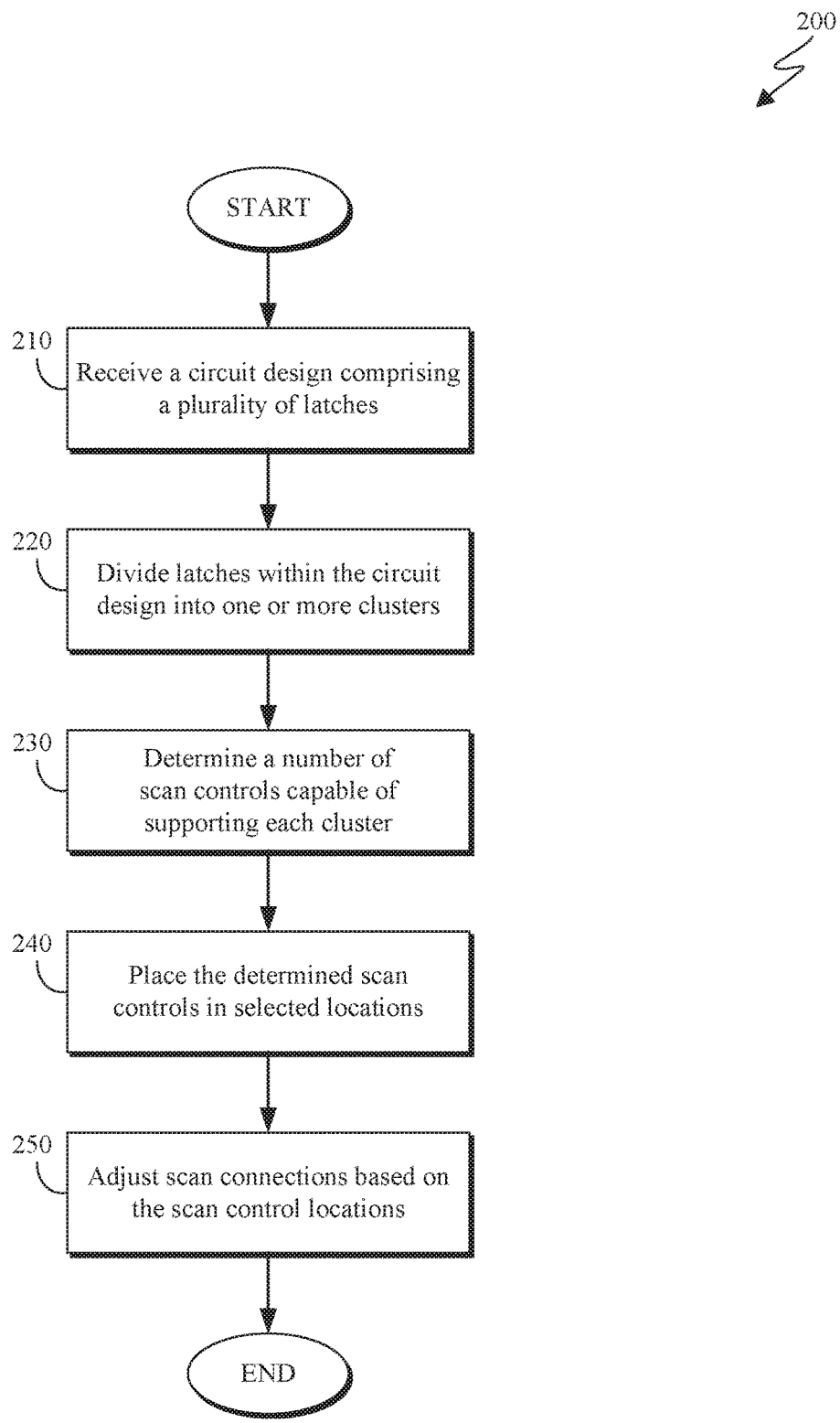
FIG. 2 is a flowchart depicting one example of a scan connection adjustment method in accordance with some embodiments of the present invention.

FIG. 2 is a flowchart depicting one example of a scan connection adjustment method 200 in accordance with some embodiments of the present invention. As depicted, scan connection adjustment method 200 includes receiving (210) a circuit design, dividing (220) latches within the circuit design into one or more clusters, determining (230) a number of scan controls for each cluster, placing (240) the determined scan controls in selected locations, and adjusting (250) the scan connections based on the scan control location. Scan connection adjustment method 200 may enable more efficient circuit testing.

Receiving (210) a circuit design may include receiving an electronic representation of a circuit to be tested. In some embodiments, the circuit design may correspond to integrated circuit 130 as described with respect to FIG. 1. In other embodiments, the circuit design may correspond to an integrated circuit yet to be constructed. The circuit design may include a plurality of latches connected by one or more scan connections. In some embodiments, the circuit design includes location information corresponding to the plurality of latches. Example circuit designs are depicted with respect to FIGS. 3A, 3B, and 3C.

Dividing (220) latches within the circuit design into one or more clusters may include identifying latches that are within a selected range of one another. In one embodiment, dividing (220) latches into one or more clusters further includes determining a total distance spanned by existing scan connections between the latches in each cluster. Dividing (220) latches into one or more clusters may further include adjusting clusters so that the total scan connection distance in each cluster is less than a selected maximum distance.

Determining (230) a number of scan controls for each cluster may include identifying a number of latches within each cluster and a cumulative distance of the scan connections between the latches. A scan control may only be capable of supporting a predetermined number of latches spanning a predetermined maximum distance, and therefore multiple scan controls may be required for each cluster. In some embodiments, the latches may be clustered such that one scan control is capable of supporting each cluster. In other embodiments, multiple scan controls may be assigned to a cluster based on the number of latches in the cluster.

Placing (240) the determined scan controls in selected locations may include determining a selected location for each scan control. The selected location may correspond to a location that minimizes the additional scan connection distance required to connect the scan control to the latches in the cluster. In one embodiment, the scan control locations are selected without respect to the existing scan connections; that is, the scan control is placed in a location that enables a shortest scan connection path between the latches, regardless of whether or not the shortest scan connection path includes the existing scan connections. An example of this location selection is depicted and described with respect to FIGS. 3A, 3B, and 3C.

Adjusting (250) the scan connections based on the scan control location may include identifying a shortest scan connection path that connects all the latches and the scan controls corresponding to a cluster. The existing scan connections may then be adjusted to match the shortest scan connection path wherever they differ. In one embodiment, where the circuit design corresponds to an electronic representation of a circuit, adjusting (250) the scan connections comprises updating the electronic representation to reflect the shortest scan connection path. In one embodiment, where the circuit design corresponds to an integrated circuit, adjusting (250) the scan connections comprises altering the wiring of the integrated circuit to match the shortest scan connection path. Adjusting (250) the scan connections may include reordering the occurrences of the existing scan connections.

Figure 3A:
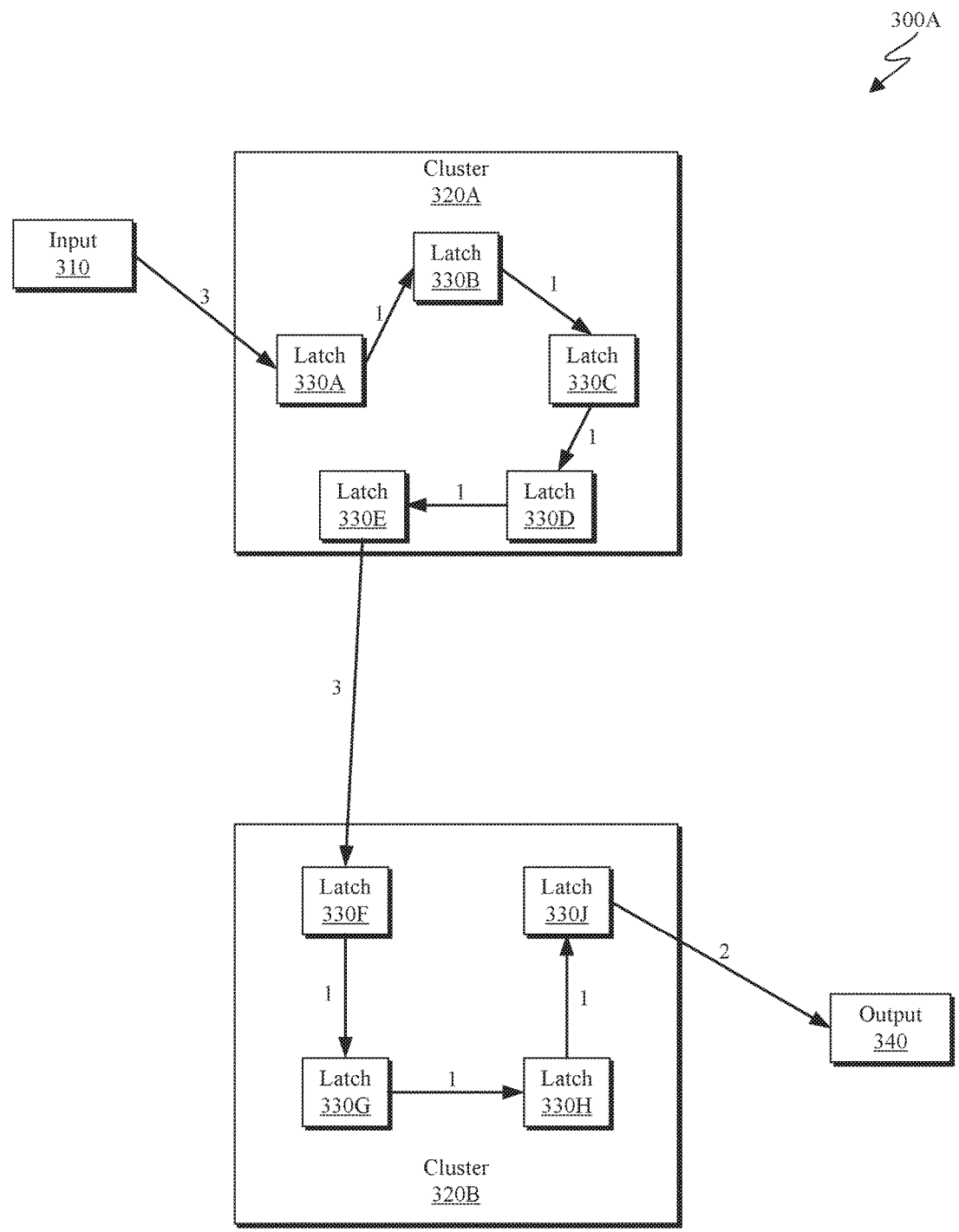
FIG. 3A is a block diagram depicting one example of latch clusters connected by unadjusted scan connections in accordance with one embodiment of the present invention.

FIG. 3A is a block diagram depicting one example of an integrated circuit 300A comprising latch clusters connected by unadjusted scan connections in accordance with one embodiment of the present invention. As depicted, integrated circuit 300A includes scan input 310, clusters 320, latches 330, and scan output 340. Integrated circuit 300A may correspond to a circuit that may be adjusted using a method such as scan connection adjustment method 200.

Scan input 310 may correspond to the origin of a scan chain configured to test integrated circuit 300A. The scan chain connects the latches within clusters 320 to one another, and terminates at scan output 340. Scan output 340 may provide diagnostic information corresponding to the latches 330 through which the scan chain runs.

Clusters 320 each comprise a plurality of latches 330. As depicted, cluster 320A includes latches 330A, 330B, 330C, 330D, and 330E. Cluster 320B includes latch 330F, 330G, 330H, and 330J. The clusters have been determined to include latches nearest one another that may be managed by one scan control (depicted with respect to FIGS. 3B and 3C).

Figure 3B:
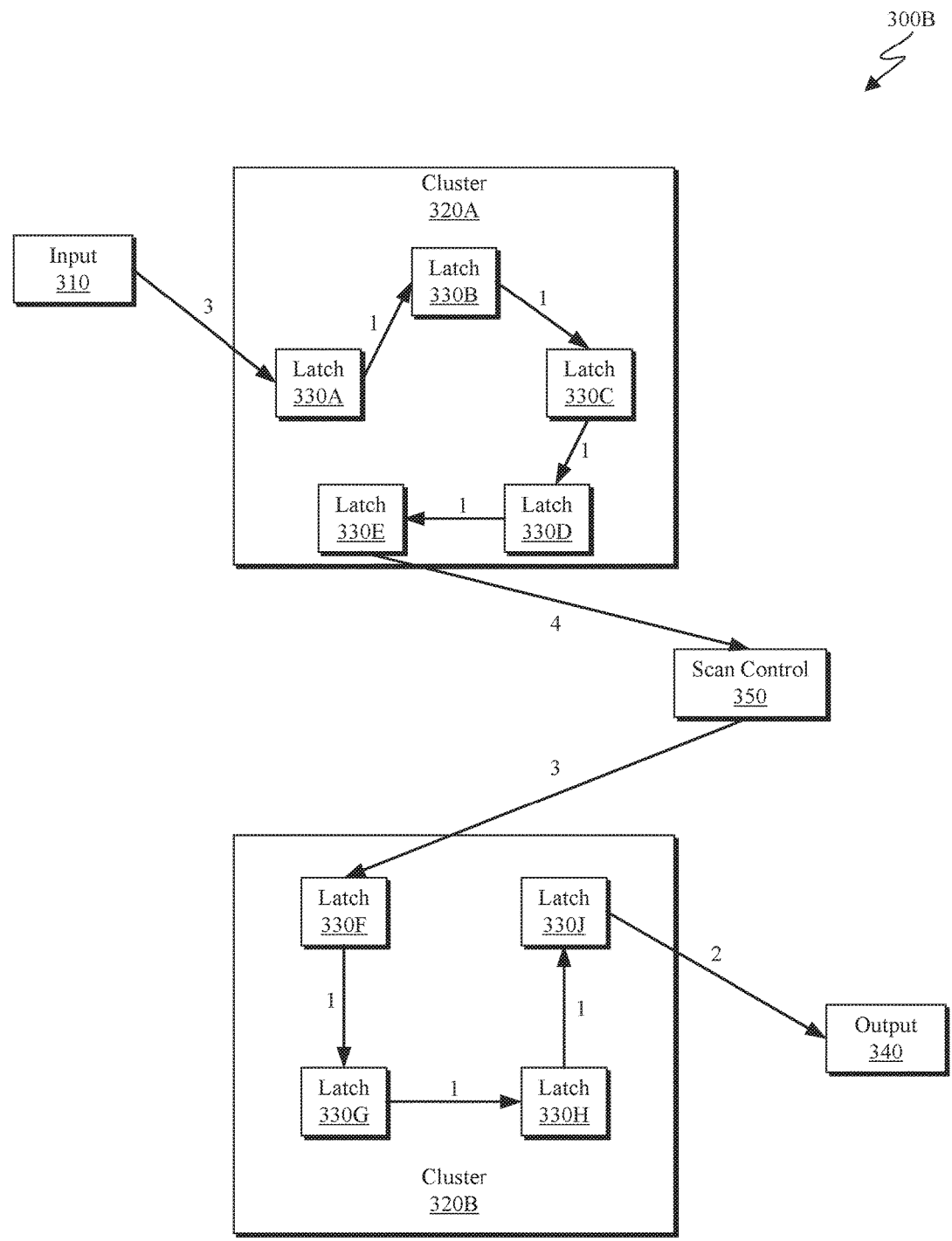
FIG. 3B is a block diagram depicting one example of latch clusters connected to a scan control by unadjusted scan connections in accordance with one embodiment of the present invention.

Latches 330 are connected to one another via the depicted scan connections. Each scan connection is depicted with a corresponding length. In the depicted embodiment, the scan connections present correspond to a shortest scan connection path from the scan input 310 to the scan output 340 that encompasses all the latches in the circuit with a cumulative length FIG. 3B is a block diagram depicting one example of an integrated circuit 300B comprising latch clusters connected to a scan control by unadjusted scan connections in accordance with one embodiment of the present invention. As depicted, integrated circuit 300B includes scan input 310, clusters 320, latches 330, scan output 340, and scan control 350. Integrated circuit 300B comprises the same latches and clusters as integrated circuit 300A, but the scan connection between the clusters has been altered such that cluster 320A is connected to scan control 350 via latch 330E, and scan control 350 is connected to cluster 320B via latch 330F. Integrated circuit 300B has a cumulative scan connection length of 19.

Figure 3C:
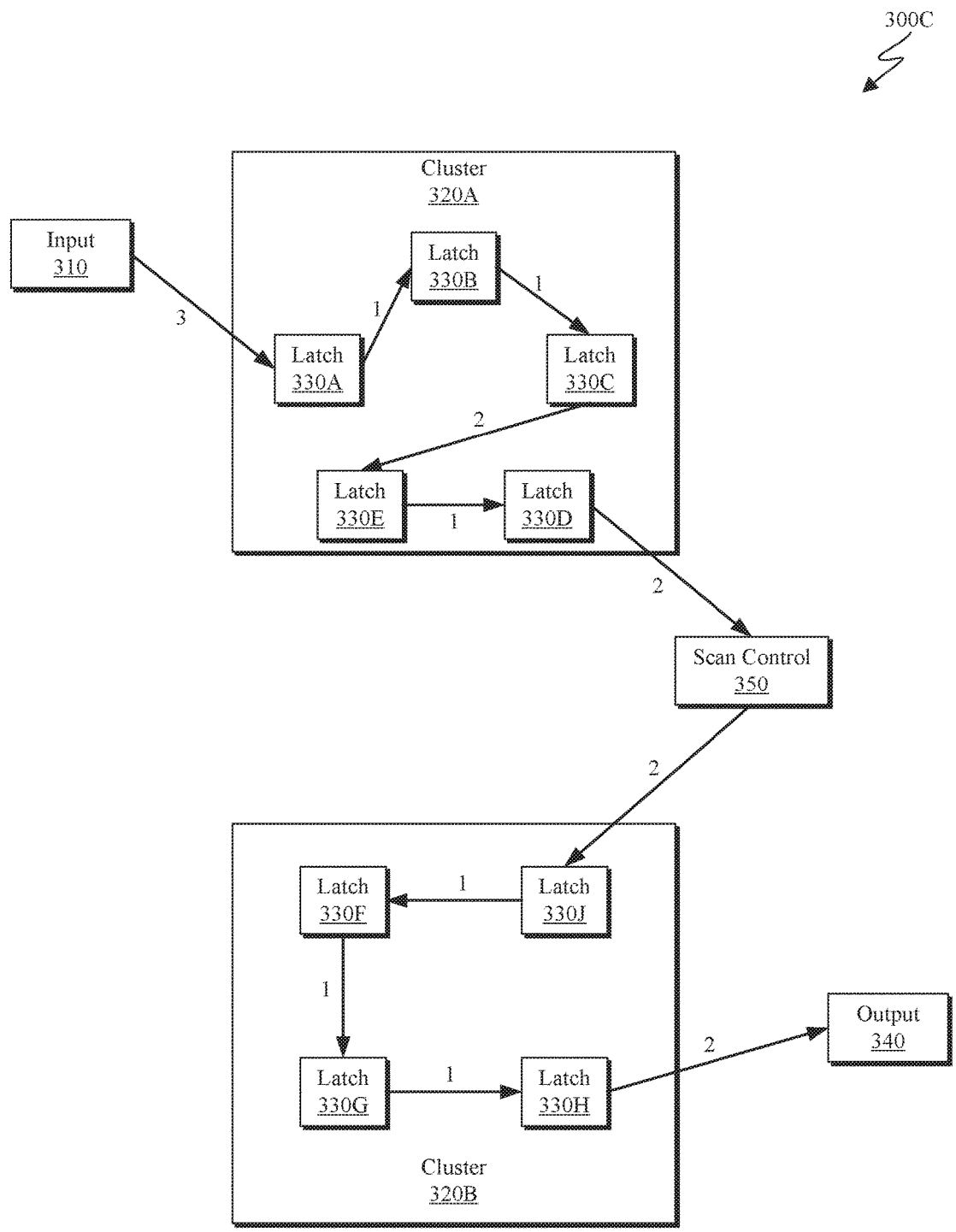
FIG. 3C is a block diagram depicting one example of latch clusters connected to a scan control by adjusted scan connections in accordance with one embodiment of the present invention.

FIG. 3C is a block diagram depicting one example of an integrated circuit 300C comprising latch clusters connected to a scan control by adjusted scan connections in accordance with one embodiment of the present invention. As depicted, integrated circuit 300C includes scan input 310, clusters 320, latches 330, scan output 340, and scan control 350. Integrated circuit 300C comprises the same latches and clusters as integrated circuits 300A and 300B, but the scan connections have been adjusted to correspond to a shortest path including scan control 350. For example, with respect to cluster 320A, instead of the latches being connected 330A to 330B to 330C to 330D to 330E to scan control 350 as is depicted with respect to FIG. 3B, the latches are connected 330A to 330B to 330C to 330E to 330D to scan control 350. Similarly, with respect to cluster 320B, instead of the latches being connected scan control 350 to 330F to 330G to 330H to 330J to output 340, the latches are connected scan control 350 to 330J to 330F to 330G to 330H to output 340. Connecting the latches in such a manner enables the cumulative scan connection length to be reduced from 19 with respect to the scan connection configuration depicted in integrated circuit 300B to 17 with respect to the scan connection configuration depicted in integrated circuit 300C.

Figure 4:
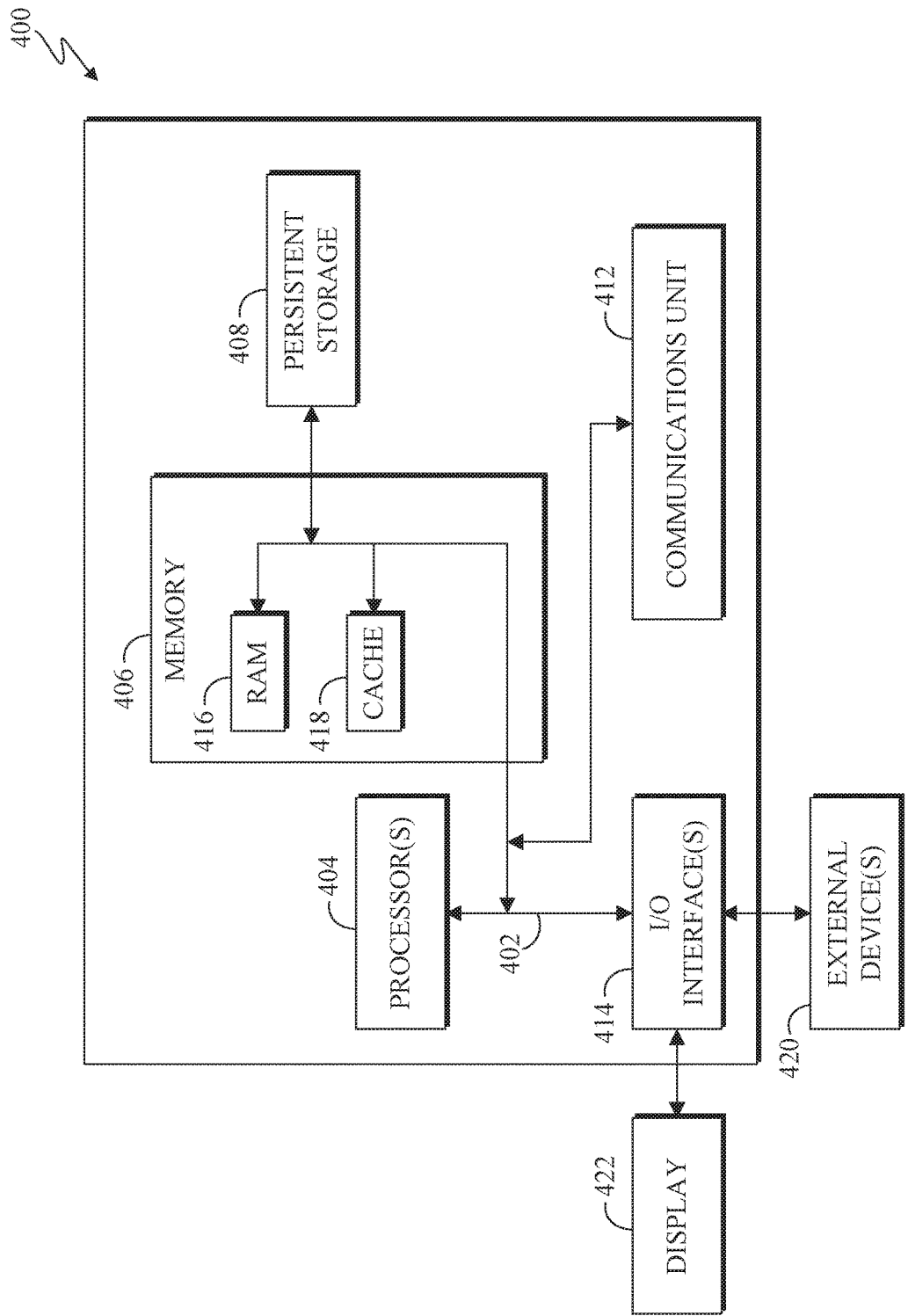
FIG. 4 depicts a block diagram of one example of a computer, in accordance with some embodiments of the present invention.

FIG. 4 depicts a block diagram of components of computer 400 in accordance with an illustrative embodiment of the present invention. It should be appreciated that FIG. 4 provides only an illustration of one implementation and does not imply any limitations with regard to the environments in which different embodiments may be implemented. Many modifications to the depicted environment may be made.

As depicted, the computer 400 includes communications fabric 402, which provides communications between computer processor(s) 404, memory 406, persistent storage 408, communications unit 412, and input/output (I/O) interface(s) 414. Communications fabric 402 can be implemented with any architecture designed for passing data and/or control information between processors (such as microprocessors, communications and network processors, etc.), system memory, peripheral devices, and any other hardware components within a system. For example, communications fabric 402 can be implemented with one or more buses.

Memory 406 and persistent storage 408 are computer-readable storage media. In this embodiment, memory 406 includes random access memory (RAM) 416 and cache memory 418. In general, memory 406 can include any suitable volatile or non-volatile computer-readable storage media.

One or more programs may be stored in persistent storage 408 for access and/or execution by one or more of the respective computer processors 404 via one or more memories of memory 406. In this embodiment, persistent storage 408 includes a magnetic hard disk drive. Alternatively, or in addition to a magnetic hard disk drive, persistent storage 408 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 408 may also be removable. For example, a removable hard drive may be used for persistent storage 408. Other examples include optical and magnetic disks, thumb drives, and smart cards that are inserted into a drive for transfer onto another computer-readable storage medium that is also part of persistent storage 408.

Communications unit 412, in these examples, provides for communications with other data processing systems or devices. In these examples, communications unit 412 includes one or more network interface cards. Communications unit 412 may provide communications through the use of either or both physical and wireless communications links.

I/O interface(s) 414 allows for input and output of data with other devices that may be connected to computer 400. For example, I/O interface 414 may provide a connection to external devices 420 such as a keyboard, keypad, a touch screen, and/or some other suitable input device. External devices 420 can also include portable computer-readable storage media such as, for example, thumb drives, portable optical or magnetic disks, and memory cards. Software and data used to practice embodiments of the present invention can be stored on such portable computer-readable storage media and can be loaded onto persistent storage 408 via I/O interface(s) 414. I/O interface(s) 414 also connect to a display 422.

Display 422 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computer/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computer/processing device receives computer readable program instructions from the network and forwards the computer readable program instructions for storage in a computer readable storage medium within the respective computer/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   receiving a circuit design comprising an input scan chain comprising a plurality of latches connected by one or more scan connections;
   dividing the plurality of latches into one or more clusters;
   determining a number of scan controls for each cluster;
   placing the determined scan controls in selected locations, wherein the selected location for each scan control corresponds to a location where the cumulative distance from the scan control to each latch is minimized; and
   adjusting the scan connections based on the scan control location; and
   altering an integrated circuit corresponding to the circuit design according to the adjusted scan connections.

2. The method of claim 1, wherein dividing the plurality of latches into clusters comprises partitioning the latches into clusters based on the physical latch locations.

3. The method of claim 1, wherein determining a number of scan controls required per cluster comprises:
   determining a number of latches in each cluster and the distance between the latches in each cluster;
   calculating a number of latches a scan control can support within each cluster; and
   determining the number of scan controls capable of supporting each cluster.

4. The method of claim 1, wherein placing the determined scan controls in selected locations comprises:
   determining a location at which a cumulative distance from the scan control to each latch is minimized; and
   placing the scan control at the determined location.

5. The method of claim 1, wherein adjusting the scan connections based on the scan control location comprises:
   determining a shortest path that connects the latches in the cluster and the scan control in the cluster; and
   adjusting the scan connections to match the determined shortest path.

6. The method of claim 1, wherein a scan control comprises:
   any combinational gate that can be used to execute a scan operation; and
   any sequential non-scan gate that can be used to execute a scan operation or a non-scan operation.

7. The method of claim 1, wherein adjusting the scan connections comprises reordering occurrences of the existing scan connections.

8. A computer program product comprising:
   one or more computer readable storage media and program instructions stored on the one or more computer readable storage media, the program instructions comprising instructions to:
   receive a circuit design comprising an input scan chain comprising a plurality of latches connected by one or more scan connections;
   divide the plurality of latches into one or more clusters;
   determine a number of scan controls for each cluster;
   place the determined scan controls in selected locations, wherein the selected location for each scan control corresponds to a location where the cumulative distance from the scan control to each latch is minimized;
   adjust the scan connections based on the scan control location; and
   alter an integrated circuit corresponding to the circuit design according to the adjusted scan connections.

9. The computer program product of claim 8, wherein the instructions to divide the plurality of latches into clusters comprise instructions to partition the latches into clusters based on the physical latch locations.

10. The computer program product of claim 8, wherein the instructions to determine a number of scan controls required per cluster comprise instructions to:
    determine a number of latches in each cluster and the distance between the latches in each cluster;
    calculate a number of latches a scan control can support within each cluster; and
    determine the number of scan controls capable of supporting each cluster.

11. The computer program product of claim 8, wherein the instructions to place the determined scan controls in selected locations comprise instructions to:
    determine a location at which a cumulative distance from the scan control to each latch is minimized; and place the scan control at the determined location.

12. The computer program product of claim 8, wherein the instructions to adjust the scan connections based on the scan control location comprise instructions to:
 determine a shortest path that connects the latches in the cluster and the scan control in the cluster; and
 adjust the scan connections to match the determined shortest path.

13. The computer program product of claim 8, wherein a scan control comprises:
 any combinational gate that can be used to execute a scan operation; and
 any sequential non-scan gate that can be used to execute a scan operation or a non-scan operation.

14. The computer program product of claim 8, wherein the instructions to adjust the scan connections comprise instructions to reorder occurrences of the existing scan connections.

15. A computer system comprising:
 one or more computer processors;
 one or more computer-readable storage media;
 program instructions stored on the computer-readable storage media for execution by at least one of the one or more processors, the program instructions comprising instructions to:
 receive a circuit design comprising an input scan chain comprising a plurality of latches connected by one or more scan connections;
 divide the plurality of latches into one or more clusters;
 determine a number of scan controls for each cluster;
 place the determined scan controls in selected locations, wherein the selected location for each scan control corresponds to a location where a cumulative distance from the scan control to each latch is minimized; and
 adjust the scan connections based on the scan control location; and
 alter an integrated circuit corresponding to the circuit design according to the adjusted scan connections.

16. The computer system of claim 15, wherein the instructions to divide the plurality of latches into clusters comprise instructions to partition the latches into clusters based on the physical latch locations.

17. The computer system of claim 15, wherein the instructions to determine a number of scan controls required per cluster comprise instructions to:
 determine a number of latches in each cluster and the distance between the latches in each cluster;
 calculate a number of latches a scan control can support within each cluster; and
 determine the number of scan controls capable of supporting each cluster.

18. The computer system of claim 15, wherein the instructions to place the determined scan controls in selected locations comprise instructions to:
 determine a location at which a cumulative distance from the scan control to each latch is minimized; and
 place the scan control at the determined location.

19. The computer system of claim 15, wherein the instructions to adjust the scan connections based on the scan control location comprise instructions to:
 determine a shortest path that connects the latches in the cluster and the scan control in the cluster; and
 adjust the scan connections to match the determined shortest path.

20. The computer system of claim 15, wherein a scan control comprises:
 any combinational gate that can be used to execute a scan operation; and
 any sequential non-scan gate that can be used to execute a scan operation or a non-scan operation.

\* \* \* \* \*